(12) United States Patent
Youngner et al.

(10) Patent No.: US 8,242,851 B2
(45) Date of Patent: Aug. 14, 2012

(54) PROCESSES FOR STABILIZING A VCSEL IN A CHIP-SCALE ATOMIC CLOCK

(75) Inventors: Daniel W. Youngner, Maple Grove, MN (US); Son T. Lu, Plymouth, MN (US); Jeff A. Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 67 days.

(21) Appl. No.: 12/887,259

(22) Filed: Sep. 21, 2010

(65) Prior Publication Data

US 2011/0187465 A1 Aug. 4, 2011

Related U.S. Application Data

(60) Provisional application No. 61/301,497, filed on Feb. 4, 2010.

(51) Int. Cl.
*H03B 17/00* (2006.01)
*H01S 1/06* (2006.01)

(52) U.S. Cl. .......................................... 331/94.1; 331/3
(58) Field of Classification Search .................. 331/94.1, 331/3
See application file for complete search history.

(56) References Cited

U.S. PATENT DOCUMENTS

| | | |
|---|---|---|
| 5,614,708 A | 3/1997 | Koishi et al. |
| 5,644,353 A | 7/1997 | Sarraf |
| 5,818,626 A | 10/1998 | Engstrom et al. |
| 6,108,025 A | 8/2000 | Li et al. |
| 6,172,570 B1 * | 1/2001 | Deng ............................. 331/3 |
| 6,888,780 B2 | 5/2005 | Happer et al. |
| 7,323,941 B1 | 1/2008 | Happer et al. |
| 7,468,637 B2 | 12/2008 | Braun et al. |
| 8,067,990 B2 * | 11/2011 | Chindo et al. ............... 331/94.1 |
| 2006/0022761 A1 | 2/2006 | Abeles et al. |
| 2007/0247241 A1 | 10/2007 | Braun et al. |

OTHER PUBLICATIONS

Youngner et al., "U.S. Appl. No. 12/873,441; Apparatus and Methods for Alkali Vapor Cells", Sep. 1, 2010.
Youngner et al., "U.S. Appl. No. 12/879,394, Fabrication Techniques to Enhance Pressure Uniformity in Anodically Bonded Vapo", Sep. 10, 2010.
Youngner et al., "U.S. Appl. No. 12/884,489; Designs and Processes for Thermally Stabilizing a Vertical Cavity Surface Emitt", Sep. 17, 2010.
Youngner et al., "U.S. Appl. No. 12/891,441; Chip-Scale Atomic Clock With Two Thermal Zones", filed Sep. 27, 2010.

* cited by examiner

*Primary Examiner* — Joseph Chang
(74) *Attorney, Agent, or Firm* — Fogg & Powers LLC

(57) ABSTRACT

A method to construct a chip-scale atomic clock is provided. The method comprises providing a scaffolding for components in a chip-scale atomic clock. The components include a laser and at least one other component. The method also includes operationally positioning the components on the scaffolding so that an emitting surface of the laser is non-parallel to partially reflective surfaces of the at least one other component.

20 Claims, 10 Drawing Sheets

US 8,242,851 B2

PROCESSES FOR STABILIZING A VCSEL IN A CHIP-SCALE ATOMIC CLOCK

CROSS-REFERENCE TO RELATED APPLICATION

This application claims the benefit of U.S. Provisional Patent Application Ser. No. 61/301,497, filed on Feb. 4, 2010, which is incorporated herein by reference.

GOVERNMENT LICENSE RIGHTS

The U.S. Government may have certain rights in the present invention as provided for by the terms of Government Contract prime number FA8650-07-C-1125 with the U.S. Air Force.

BACKGROUND

Chip-Scale Atomic Clocks (CSAC) include vapor cells of alkali metals; typically either rubidium (Rb) or cesium (Cs). An optical beam propagates through the vapor, exciting hyperfine transitions in a phenomenon called coherent population trapping (CPT). An exemplary rubidium-based CSAC, for example, works by exciting the D1 hyperfine transition using a vertical cavity surface emitting laser (VCSEL) that is tuned to the broad absorption at 795 nm and is radio frequency (RF) modulated at 3.417 GHz, which is precisely half the D1 transition frequency. In the early days of CSAC development, Cs was preferred over Rb because readily available VCSELs at 852 nm could be used to excite hyperfine transitions in 133 Cs vapors. More recently as 795 nm VCSELs have continued to mature, Rb has been gaining favor. Rubidium has a simpler Zeeman structure, which provides better signal-to-noise ratio than Cs. Rubidium also has a lower vapor pressure than Cs, which allows CSACs to operate at higher temperatures.

CSACs are not simply shrunken versions of bench-top atomic clocks, however. Several attributes that are unique to CSACs dominate the stability, performance in the field, and reliability of the CSAC. One of the critical attributes is stability of optical power transmitted through the vapor cell. Chip-Scale Atomic Clocks (CSACs) require a laser, such as a vertical cavity surface emitting laser (VCSEL), to emit radiation in a very stable wavelength and having a stable output power. If the optical power level varies or if the wavelength varies, the vapor in the vapor cell of the CSAC experiences an AC stark shift that causes the clock frequency of the CSAC to change.

The optical beam emitted from the laser reflects off of several partially reflective surfaces in the CSAC. If any portion of the optical beam emitted by the laser is reflected off of one of the several partially reflective surfaces in the CSAC back into the laser, the wavelength and/or the output power level of the laser is altered due to optical feedback effects. This optical feedback creates both noise and changes in the power of the output optical beam, which translate into noise and changes in the clock frequency of the CSAC.

SUMMARY

The present application relates to a method to construct a chip-scale atomic clock. The method comprises providing a scaffolding for components in a chip-scale atomic clock. The components include a laser and at least one other component. The method also includes operationally positioning the components on the scaffolding so that an emitting surface of the laser is non-parallel to partially reflective surfaces of the at least one other component.

DRAWINGS

In accordance with common practice, the various described features are not drawn to scale but are drawn to emphasize features relevant to the present invention. Like reference characters denote like elements throughout figures and text.

DETAILED DESCRIPTION

In order to prevent optical feedback to a laser, the methods and systems described here disclose packaging techniques that provide ways to deliberately tilt the partially reflective surfaces of components in a CSAC so that the reflected light is directed harmlessly away from the laser (e.g., a VCSEL). These techniques allow the laser to maintain a stable wavelength and stable optical power output over time.

An external cavity VCSEL is a VCSEL with partially reflective surfaces (e.g., mirrors) beyond the surface of the VCSEL die itself. A partially reflective surface that reflects back to the VCSEL becomes part of the lasing cavity by feeding back a portion of the optical power into the VCSEL. This feedback affects the lasing wavelength, the output power, and polarization of the output electro-magnetic field, depending on which mode (or modes) of the VCSEL the light is fed back into. The CSAC physics package includes a plurality of partially-reflective surfaces that form external cavities with the cavity of the VCSEL. As defined herein, a CSAC physics package is a CSAC device that is packaged for handling and for operation.

In one implementation of this embodiment, the laser is an edge emitting laser that is operably arranged on end to emit light toward the other elements in the CSAC. In this case, the partially reflective surfaces beyond the surface of the edge emitting die itself form an external cavity with the edge emitting lasing cavity. Aligning a VCSEL in the CSAC is easier than aligning an edge emitting laser in the CSAC; therefore VCSELs are referred to in the following discussion.

The optical feedback from the partially reflective surfaces into the VCSEL is a function of the reflectivity of the surfaces (which is a function of the incident wavelength), and of the distance between the VCSEL and the partially reflective surface. Sub-Angstrom variations in the distance between the emitting surface of the VCSEL and the partially reflective surface affect the magnitude of the feedback. The sign of the phase of the feedback changes as the spacing changes by $\lambda/2$, where $\lambda$ is the wavelength of the optical power emitted from the VCSEL. For an embodiment in which the lasing wavelength λ, is about 800 nm, the sign of the phase of the feedback changes by 360° or 2π radians as the spacing changes by about 400 nm.

Figure 1:
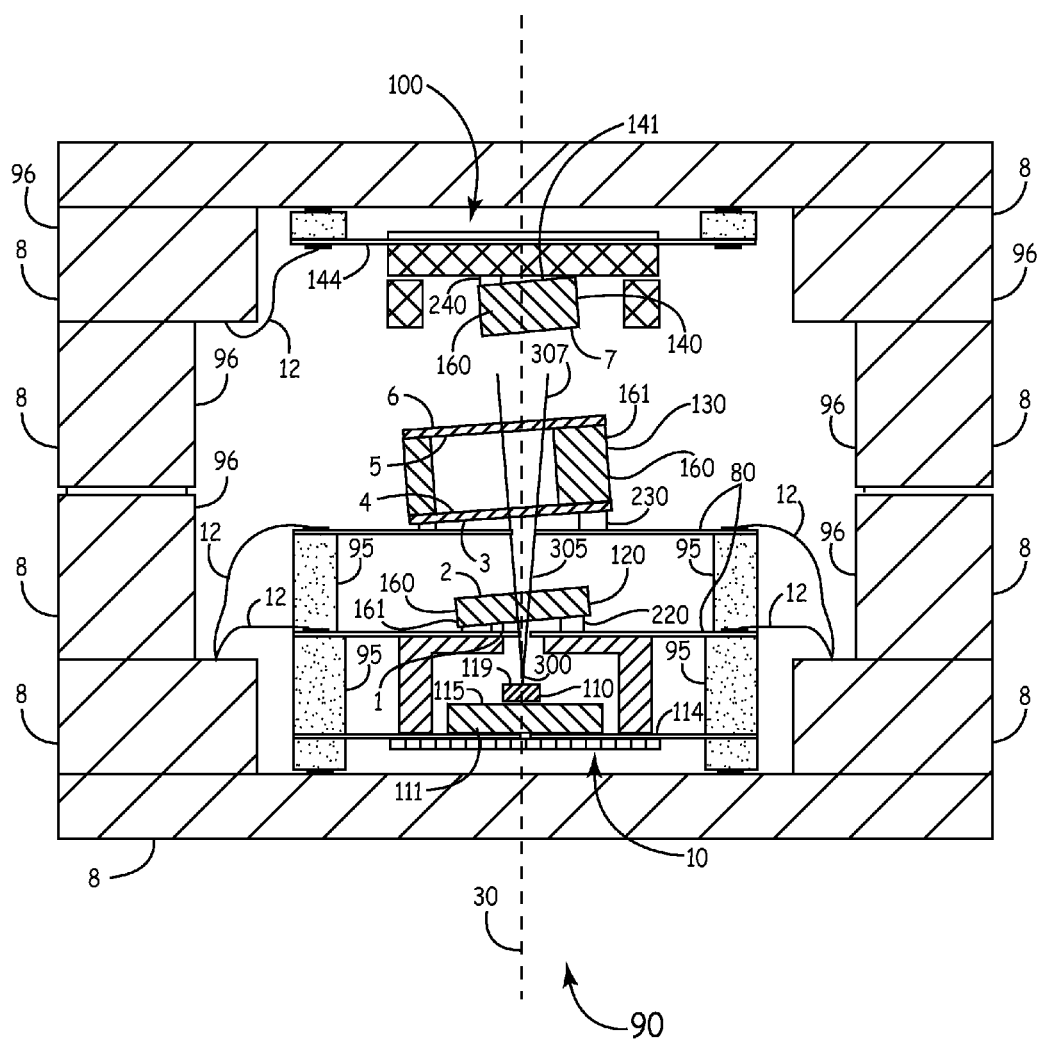
FIGS. 1 and 2 show cross sectional views of embodiments of CSACs in accordance with the present invention.
Figure 2:
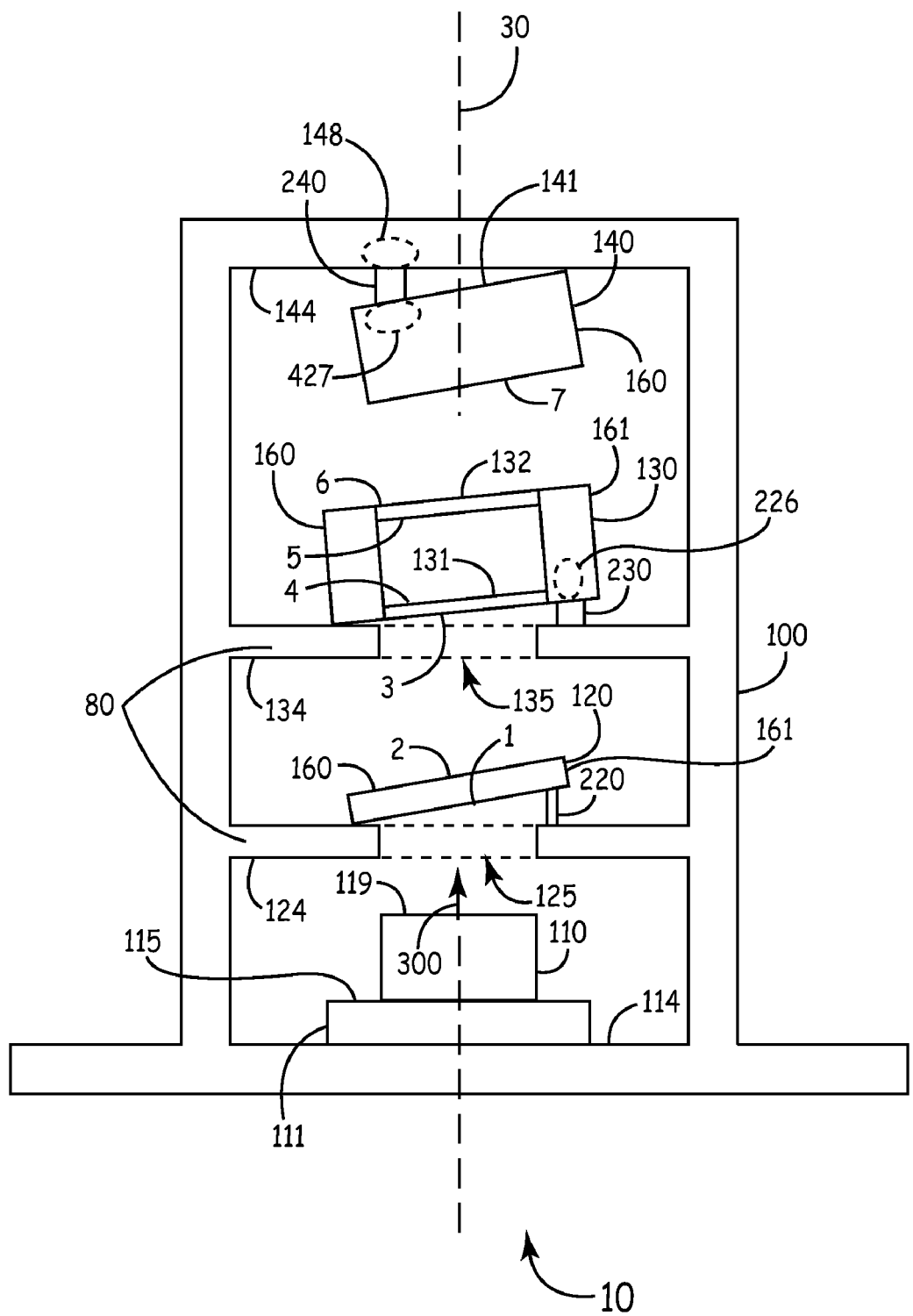

It is difficult to control the plurality of gaps to 400 nm. Hence, without a technique to tilt the partially reflective surfaces, unknown and variable feedback into the VCSEL causes uncontrollable variations in the optical beam from physics package to physics package. FIGS. 1 and 2 show cross sectional views of embodiments of CSACs in accordance with the present invention.

FIG. 1 shows a cross sectional view of an embodiment of a CSAC 10 in a physics package 90. The CSAC 10 is encased in a housing 8 and the lead lines 12 are used to operate the CSAC 10. The CSAC 10 includes a VCSEL 110, a quarter wave plate 120, a vapor cell 130, and a detector 140, which are supported in a scaffolding represented generally at 100. As defined herein, a scaffolding is a framework including a plurality of scaffold sections operable to support a respective plurality of components. The plurality of scaffold sections includes a bottom scaffold section 114, a top scaffold section 144, and intermediate scaffold sections 80. The intermediate scaffold sections 80 include a first scaffold section 124 and a second scaffold section 134, which are located between the bottom scaffold section 114 and the top scaffold section 144. The scaffold sections 114, 124, 134, and 144 are respectively associated with the VCSEL 110, the quarter wave plate 120, the vapor cell 130, and the detector 140 of the CSAC 10. The scaffold sections 114, 124, 134, and 144 are spaced apart from each other by spacers represented generally at 95 and 96. In one implementation of this embodiment, the spacers 95 are formed in silicon and the spacers 96 are formed in ceramic.

The first scaffold section 124 and a second scaffold section 134 each have an opening (scaffold opening), which is not visible in FIG. 1. The first scaffold section 124 and the second scaffold section 134 are also referred to herein as the first intermediate scaffold section 124 and the second intermediate scaffold section 134, respectively.

Figure 4:
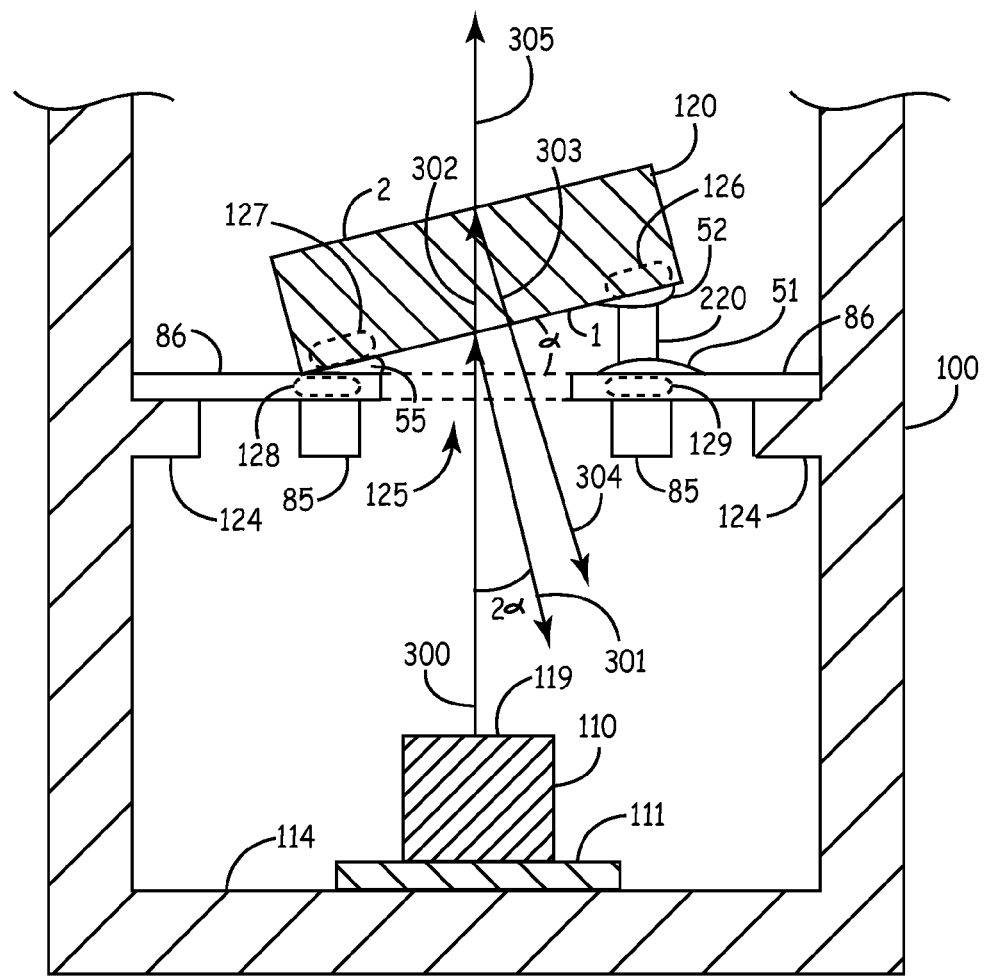
FIG. 4 shows an embodiment of an operational laser and another component positioned on the scaffolding of FIG. 2.
Figure 5:
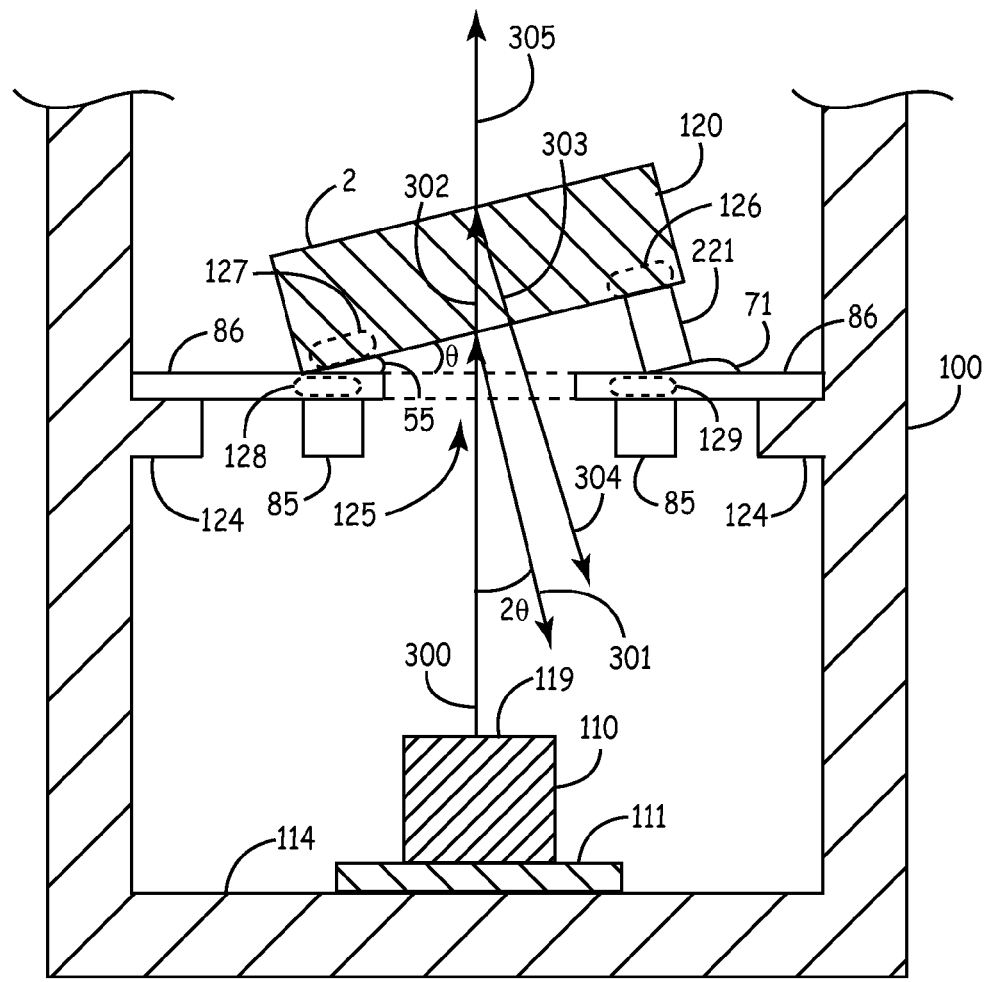
FIG. 5 shows an embodiment of an operational laser and another component positioned on a scaffolding in accordance with the present invention.

The openings in the intermediate scaffold sections 80 are aligned with a center line 30 that extends from the bottom scaffold section 114 to the top scaffold section 144. The quarter wave plate 120 and the vapor cell 130 of the CSAC 100 are associated with the intermediate scaffold sections 80 and are operationally positioned in alignment with the center line 30. Specifically, the quarter wave plate 120 and the vapor cell 130 (also referred to herein as intermediate components 161) are attached to the intermediate scaffold sections 80 in a configuration so that the intermediate components 120 and 130 span (extend across) the scaffold openings in an incline. When a component 120 or 130 spans a scaffold opening in an incline, the partially reflective surfaces (or surface) of the intermediate component are at an acute incline angle (or tilt angle) with respect to the supporting surface of the scaffold sections. This angle is shown in FIGS. 2, 4, and 5 as described below.

The quarter wave plate 120, the vapor cell 130, and the detector 140 are referred to herein as "other components 160." The other components 160 are offset from each other and the VCSEL 110 and are aligned along the center line 30. The electro-magnetic radiation (also referred to herein as output optical beam and light) emitted from the VCSEL 110 is incident on at least a portion of the quarter wave plate 120, the vapor cell 130, and the detector 140. In one implementation of this embodiment, the vapor cell 130 is a rubidium vapor cell. In another implementation of this embodiment, the vapor cell 130 is a cesium vapor cell.

As shown in FIG. 1, the light propagates parallel to the center line 30 and essentially overlaps the center line 30. There are seven partially reflective surfaces 1-7 in the other components 160 shown in the CSAC 10. The VCSEL 110 has a top surface 119, which is also referred to herein as emitting surface 119. Light 300 is emitted from the VCSEL 110 and propagates toward the quarter wave plate 120. The quarter wave plate 120 has a first partially reflective surface 1 and a second partially reflective surface 2 to reflect the light 300. The light 300 transmitted through the quarter wave plate 120 propagates as light 305 along the center line 30 toward the vapor cell 130. The vapor cell 130 has partially reflective surfaces 3, 4, 5, and 6 to reflect the light 305. The light 307 transmitted through the vapor cell 120 propagates towards the detector 140. The light 307 propagates along the center line 30 through toward the detector 140, which is operable to detect the incident optical power of the light 307. The detector 140 has a partially reflective surface 7 to reflect a portion of the light 307. The detector 140 has a back surface 141 that is essentially parallel to the partially reflective surface 7.

As shown in FIG. 1, the other components 160 are tilted so that the partially reflective surfaces 1-7 are not parallel to the top surface 119 of the VCSEL 110. Thus, this exemplary CSAC 10 does not have any optical feedback from reflections off of the partially reflective surfaces 1-7 into the VCSEL 110. The degree of tilting designed to prevent any portion of the divergent optical beam 300 from being directed back toward the lasing cavity of the VCSEL 110.

In order to highlight the problem with reflections from partially reflective surface of the components in a CSAC, some data for the reflectivity of exemplary other components 160 are shown in Table 1 below. The estimated reflectivity of the various partially reflective surfaces 1-7 (also referred to herein as mirrors 1-7) is shown in Column 3 of Table 1. The approximate distance between the emitting surface (top surface) 119 of the VCSEL 110 and the various partially reflective surfaces 1-7 is shown in column 4 of Table 1. For example, the exemplary first partially reflective surface 1 of the quarter wave plate 120 is 5% reflective and 420 mm above the emitting surface 119 of the VCSEL 110.

The fraction of emitted light that couples back into the VCSEL (either positively or negatively) by un-tilted components in a prior art CSAC is shown in column 5 of Table 1, and the normalized coupling coefficient (normalized reflectivity) is shown in column 6 of Table 1.

TABLE 1

Properties of the 7 mirrors in the existing CSAC physics package.

| 1 Mirror # | 2 Description | 3 Reflectivity (R) | 4 Approx Height above vesel (H) (μm) | 5 Absolute Coupling coefficient** | 6 Normalized Coupling coefficient | 7 Change in height per ° C. (angstrom) |
|---|---|---|---|---|---|---|
| 1 | Bottom of QWP | ~5% | 420 | 1.06E−05 (−49.7 dB) | 1 | 13 |
| 2 | Top of QWP (with grooves) | 15% | 920 | 6.61E−06 (−51.8 dB) | 0.63 | 28 |

TABLE 1-continued

Properties of the 7 mirrors in the existing CSAC physics package.

| 1 Mirror # | 2 Description | 3 Reflectivity (R) | 4 Approx Height above vesel (H) (μm) | 5 Absolute Coupling coefficient** | 6 Normalized Coupling coefficient | 7 Change in height per ° C. (angstrom) |
|---|---|---|---|---|---|---|
| 3 | Bottom of lower Pyrex in Rb cell | 5% | 1470 | 8.63E−07 (−60.6 dB) | 0.08 | 44 |
| 4 | Top of lower Pyrex in Rb cell | Up to ~30%* | 1570 | 4.54E−06 −53.4 dB) | 0.43 | 47 |
| 5 | Bottom of upper Pyrex in Rb cell | Up to ~30%* | 2370 | 1.99E−06 (−57.0 dB) | 0.19 | 71 |
| 6 | Top of upper Pyrex in Rb cell | 5% | 2470 | 3.06E−07 (−65.1 dB) | 0.03 | 74 |
| 7 | Photodiode | 75% | 2970 | 3.17E−06 (−55.0 dB) | 0.30 | 89 |

In the exemplary embodiment of FIG. 1, most of the distances to the partially reflective surfaces 1-7 in the CSAC 10 are controlled by silicon spacers. The thermal expansion coefficient of silicon is $\sim 3 \times 10^{-6}$ ppm/° C. The distance between the emitting surface 119 of the VCSEL 110 and the partially reflective surface 7 of the detector 140 (also referred to herein as photodiode 140) is controlled in part by a ceramic package 96 which forms at least a portion of the housing 8 shown in FIG. 1. The thermal expansion coefficient of most ceramics is $\sim 3-15 \times 10^{-6}$ ppm/° C. For $3 \times 10^{-6}$ ppm/° C. for all layers, the changes in the gap (height) from the emitting surface 119 of the VCSEL 110 to the partially reflective surface (in angstroms per ° C.) is shown in Column 7. In total, the thermal expansion coefficients of silicon and ceramic, as the ambient temperature changes from −40 C to +70 C, cause the spacing between the components of the physics package 90 to shift by up to a micron. Thus, over that temperature range, the reflective feedback into the VCSEL 110 from untilted components would cause changes in the output of the clock that can vary over time scales ranging from seconds to years.

Moreover, there is a layer of solder connecting all of the silicon spacers, and connecting the various portions of the package. The solder expands and/or shrinks with temperature variations. The solder experiences varying stresses from the layers around it during each expansion and/or contraction. In some cases, the stress causes the solder to undergo a (permanent) plastic flow. The stress-relieving events may not happen when stress is at its maximum, but may occur, seconds, hours, or months after the stress is applied.

In a similar vein, the polyimide tethers that support the various components of the physics package 90 can flex by up to a micron as the CSAC 10 experiences shock and vibration. If the partially reflective surfaces 1-7 are not tilted with respect to the emitting surface 119 of the VCSEL 110, reflective feedback into the VCSEL 110 changes significantly during those shock events, leading to changes in the output of the clock that can vary over time scales ranging from microseconds to seconds.

Even with coupling in the −72 dB range, the phase of the feedback has a strong effect on the distribution of optical power and the magnitude of the total power. It is known in the art that a 1% change in VCSEL output power at 100 μW induces up to a 1 μW*$1.4 \times 10^{-10}$ Hz/Hz/μW=$1.4 \times 10^{-10}$ Hz/Hz change in frequency. A 10% change in power induces a $1.4 \times 10^{-9}$ Hz change in the clocks frequency, which is typically beyond the acceptable limits desired for optimal operation of a CSAC.

In order to prevent this damaging optical feedback, the partially reflective surfaces 1-7 of the other components 160 are tilted with respect to the emitting surface 119 of the VCSEL 110 by one or more posts position between each of the other components 160 and the supporting scaffolding 100 as shown in FIG. 1.

FIG. 2 shows a cross sectional view of an embodiment of the CSAC 10 in which the scaffolding is enlarged so that scaffold openings 125 and 135 of the respective first scaffold section 124 and the second scaffold section 134 are visible. The scaffold openings 125 and 135 are aligned with the center line 30, which extends from the bottom scaffold section 114 to the top scaffold section 144. The configuration of the quarter wave plate 120, the vapor cell 130, and the detector 140 with respect to the light emitted from the VCSEL 110 are as described above with reference to FIG. 1.

Figure 3:
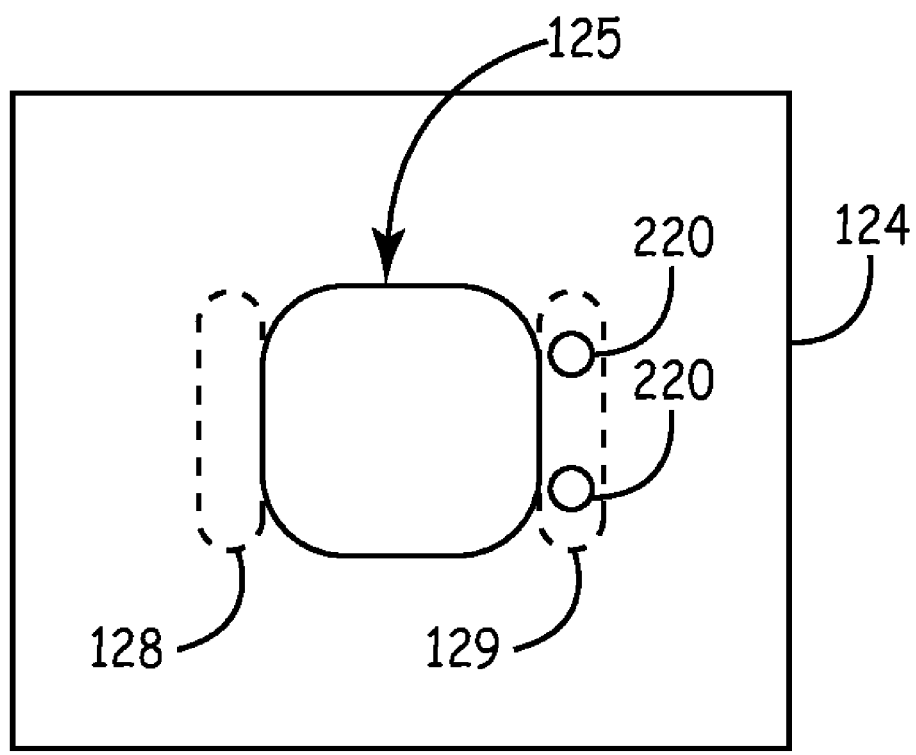
FIG. 3 shows a top view of a scaffold opening in accordance with the present invention.

FIG. 3 shows a top view of a scaffold opening 125 in accordance with the present invention. The exemplary scaffold opening 125 is shown formed in the first scaffold section 124. The exemplary scaffold opening 125 is approximately rectangular in shape, although it could be circular, elliptical, square or irregular in shape. To one side of the scaffold opening 125 is an edge region 129. On the other opposing side of the scaffold opening 125 is an edge region 128. As defined herein, an edge region is a region of the scaffold section that is close to a scaffold opening formed in the scaffold section of the scaffolding, so that the components can be operably attached to at least a portion of the edge regions.

Two circular regions 220 in the edge region 129 indicate where two posts contact the first scaffold section 124 when the quarter wave plate 120 is operably positioned on the first scaffold section 124. In one implementation of this embodiment, the two circular regions 220 in the edge region 129 indicate where bond pad are formed in the edge region 129. The bond pads can be used to attach solder and/or posts as described in detail below. In another implementation of this embodiment, bond pads are formed in the edge region 129. In this case, the bond pads in the edge region 129 are used for solder affix one edge of the quarter wave plate 120 to the edge region 129.

The scaffold opening 135 formed in the second scaffold section 134 is similar in structure and function to the illustrated first scaffold section 124. Other shapes for the scaffold openings 125 and 135 are possible, including the irregularly shaped scaffold opening 134 for the vapor cell 130 shown in FIG. 8 as described below.

FIG. 4 shows an embodiment of an operational laser and another component positioned on the scaffolding of FIG. 2.

Specifically, an expanded view of the bottom half of the scaffolding 100 of FIG. 2 is shown in FIG. 4. The VSCEL 110 is positioned on a heat sink 111, which is supported on the bottom scaffold section 114. As shown in this enlarged view, the first scaffold section 124 includes a layer 86 that rests on the scaffold section 124. In one implementation of this embodiment, the layer 86 is formed from polyimide and the scaffold opening 125 layer is surrounded by a support ring 85, which is visible in cross section as two rectangular pieces on either side of the scaffold opening 125. The support ring 85 can be silicon. This configuration thermally isolates the quarter wave plate 120 from the VCSEL 110 since polyimide is not thermally conductive. Other configurations for thermally isolating the quarter wave plate 120 from the main scaffolding 100 while supporting the quarter wave plate 120 in an incline over the scaffold opening 125 are possible as is understandable to one skilled in the art upon reading and understanding this document.

As shown in FIG. 4, the quarter wave plate 120 is tilted by a supporting post 220 on the first scaffold section 124. The edge region 129 and edge region 128 of the first scaffold region 124 (in the layer 86) are shown in cross-section in FIG. 4.

The post 220 is attached to the edge region 129 of the first scaffold section 124 by an adhesive material 51 on the edge region 129. In one implementation of this embodiment, the adhesive material 51 is epoxy and the post 220 is a photo-patternable plastic. In another implementation of this embodiment, the adhesive material 51 is a high-temperature solder dot and the post 220 is a lower-temperature solder formed on the high-temperature solder dot. In yet another implementation of this embodiment, the adhesive material 51 is a high-temperature solder dot and the post 220 is an electro-plated post formed on the high-temperature solder dot. Other combinations of materials can be used to form the adhesive material 51 and the post 220.

The edge portion 126 of the quarter wave plate 120 is positioned on the post 220. Thus, in this embodiment, the post 220 is attached to the edge region 129 of the first scaffold section 124 prior to the quarter wave plate 120 being positioned on the post 220. The edge portion 127 of the quarter wave plate 120, which opposes the edge portion 126, is supported on and attached to the edge region 128 of the first scaffold section 124. As defined herein, an edge portion of a component is the portion of the component that is toward an edge of the component and which is adjacent to the associated scaffold section when the component is attached to the scaffolding. An adhesive 55 attaches the edge portion 127 to the edge region 128. The adhesive 55 can be a solder or epoxy. In this manner, the quarter wave plate 120 spans the scaffold opening 125 in an incline, so that the first partially reflective surface 1 and the second partially reflective surface 2 of the quarter wave plate 120 is non-parallel to the emitting surface 119 of the VCSEL 110. As shown in FIG. 4, there is an exemplary incline angle α (also referred to herein as tilt angle α) between the first partially reflective surface 1 of the quarter wave plate 120 and the first scaffold section 124 having the scaffold opening 125.

Similarly, any other intermediate components (e.g., the vapor cell 130) in the CSAS 10 (FIG. 2) are positioned on intermediate scaffold sections (e.g., third scaffold section 134) so that the other intermediate components span the scaffold opening (e.g., scaffold opening 135) in an incline, so that any partially reflective surfaces (e.g., partially reflective surfaces 3-6) of the other components (e.g., the vapor cell 130) are non-parallel to the emitting surface 119 of the VCSEL 110.

Since the quarter wave plate 120 spans the scaffold opening 125, the emitted light 300, which propagates through the scaffold opening 125, is incident on the first partially reflective surface 1. A portion of the incident light 300 is reflected as reflected light 301. In FIGS. 2, 4, and 5, the light 300 is represented by an arrow, which indicates the direction of propagation of the light 300 according to standard ray optics. A portion of the light 302 that is transmitted at first partially reflective surface 1 is reflected as light 303 at the second partially reflective surface 2. A portion of the light 303 is transmitted at the first partially reflective surface 1 as light 304. Since the quarter wave plate 120 spans the scaffold opening 125 in an incline, the light 301 and 304 is directed away from the emitting surface 111 of the VCSEL 110, so there is no optical feedback from the quarter wave plate 120 into the VCSEL 110.

Similarly, there is no optical feedback from any other intermediate components into the VCSEL 110, as is understandable to one skilled in the art upon reading and understanding this document.

The some embodiments, the posts are formed by 1) depositing high-temperature solder dots on the scaffolding (structure) 100 that holds the other components 160 and 2) reflowing high-temperature solder dots on the scaffolding (structure) that holds the other components 160, and then 3) one of: a) applying a lower-temperature solder on the high-temperature solder dots on the edge region 129 of the scaffold opening 125, or b) electro-plating thick posts on the high-temperature solder dots on the edge region 129 of the scaffold opening 125.

In one implementation of this embodiment, thick nickel posts are electro-plated on the high-temperature solder dots. Other types of metals can be electroplated on the high-temperature solder dots. The high-temperature solder dots that are increased in height by the extra solder or by electroplating provide a tilt to the other components 160. In this case, the edge portion 126 of the quarter wave plate 120 is placed on the one or more electro-plating thick posts 220 located on the edge region 129 of the first scaffold section 124 while the edge portion 127 of the quarter wave plate 120 is placed on the exposed reflowed high-temperature solder dots (adhesive 55 shown in FIG. 4) on the edge region 128 of the first scaffold section 124. The high-temperature solder dots formed on the edge region 129 of the first scaffold section 124 and the second scaffold section 134 are built up to provide a tilt angle α between a surface of the scaffolding and at least one of the partially reflective surfaces.

In another implementation of this embodiment, the high-temperature solder dots are built up by applying a lower-temperature solder on the high-temperature solder dots formed on the edge region 129 of the first scaffold section 124 and the second scaffold section 134. The low-temperature solder is applied directly on top of the reflowed high-temperature solder. The bond pads that are destined to receive the high-temperature solder are larger in size than the bond pads that do not receive the high-temperature. In embodiments, the bond pads that receive the high-temperature solder are 250 µm in diameter and the high-temperature solder has solder thicknesses ranging from 150 µm to 250 µm.

In yet another implementation of this embodiment, the high-temperature solder dots are built up by plating an electro-plated thick nickel post on the high-temperature solder dots formed on the edge region the second scaffold section 134.

The detector 140 is tilted by building up high-temperature solder dots formed on the region 148 (FIG. 2) of the top scaffold section 144. The high-temperature solder dots formed on the region 148 can be built up by either adding lower-temperature solder is applied on the high-temperature solder dots or by electro-plating onto the high-temperature solder dots on the region 148 of the top scaffold section 144.

FIG. 5 shows an embodiment of an operational laser and another component positioned on the scaffolding of FIG. 2. Specifically, an expanded view of the bottom half of the scaffolding of FIG. 2 is shown in FIG. 5. FIG. 5 differs from FIG. 4 in that the post 221 in FIG. 5 is attached to section 126 on an edge portion 126 of the quarter wave plate 120 (or one of the other components 160) prior to being attached to the first scaffold section 124.

Specifically, the post 221 is attached to an edge portion 126 of the quarter wave plate 120, and is then attached by an adhesive material 71 on the edge region 129 of the first scaffold section 124. The edge portion 127 of the quarter wave plate 120, which opposes the edge portion 126, is supported on the edge region 128 of the first scaffold section 124. An adhesive 55 attaches the edge portion 127 of the quarter wave plate 120 to the edge region 128 of the first scaffold section 124. In this manner, the quarter wave plate 120 spans the scaffold opening 125 in an incline angle α, so that the first partially reflective surface 1 and the second partially reflective surface 2 of the quarter wave plate 120 is non-parallel to the emitting surface 119 of the VCSEL 110.

Figure 6:
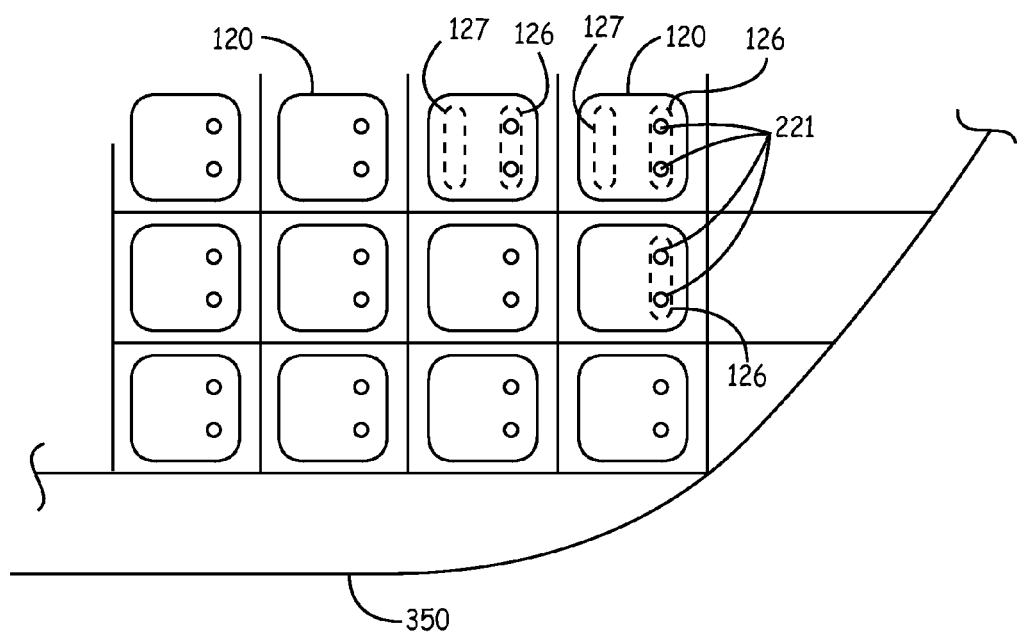
FIG. 6 shows an embodiment of a wafer comprising a plurality of other components and posts.

FIG. 6 shows an embodiment of a wafer 350 comprising a plurality of quarter wave plates 120 and posts 221. A wafer 350 could also include the vapor cells 130 or portions of the vapor cell 130. As shown in FIG. 6, the posts 221 are formed on the edge portions 126 of the respective quarter wave plates 120. In one implementation of this embodiment, the posts 221 are formed from a photo-patternable plastic, such as SU8 or epoxy. The photo-patternable plastic is patterned in one or more posts 221 in the edge portions 126 of the respective quarter wave plates 120 having heights of up to several hundred microns. In one implementation of this embodiment, the posts 221 are formed in the photo-patternable plastic and then solder (e.g., adhesive 71 shown in FIG. 5) is patterned on the posts 221 and solder (e.g., adhesive 55) is patterned on the edge portions 127 of the respective quarter wave plates 120. In this manner, each quarter wave plate 120 in the wafer 350 is ready (after the wafer 350 is diced) to be picked and placed on the first scaffold section 124 of the scaffolding 100 so that the quarter wave plate 120 spans the scaffold opening 125 in an incline.

In another implementation of this embodiment, the posts 221 are fabricated from silicon and then picked and placed onto prepared edge portions 126 of the respective quarter wave plates 120. The prepared edge portions 126 are prepared with an adhesive to attach the silicon posts 221 to the edge portions 126 of the respective quarter wave plates 120. For example, the posts 221 can be soldered or epoxied to one side (the edge portion 126) of the quarter wave plate die and then solder bumps are formed on the posts 221 and on the edge portions 127 of the quarter wave plate die.

A similar process of applying posts 230 to the vapor cell 130 and to the back surface 141 (FIG. 1) of the detector 140 is used to prepare the vapor cell 130 and the detector 140, respectively, to be tilted for operation without optical feedback in the CSAC 10.

Figure 7:
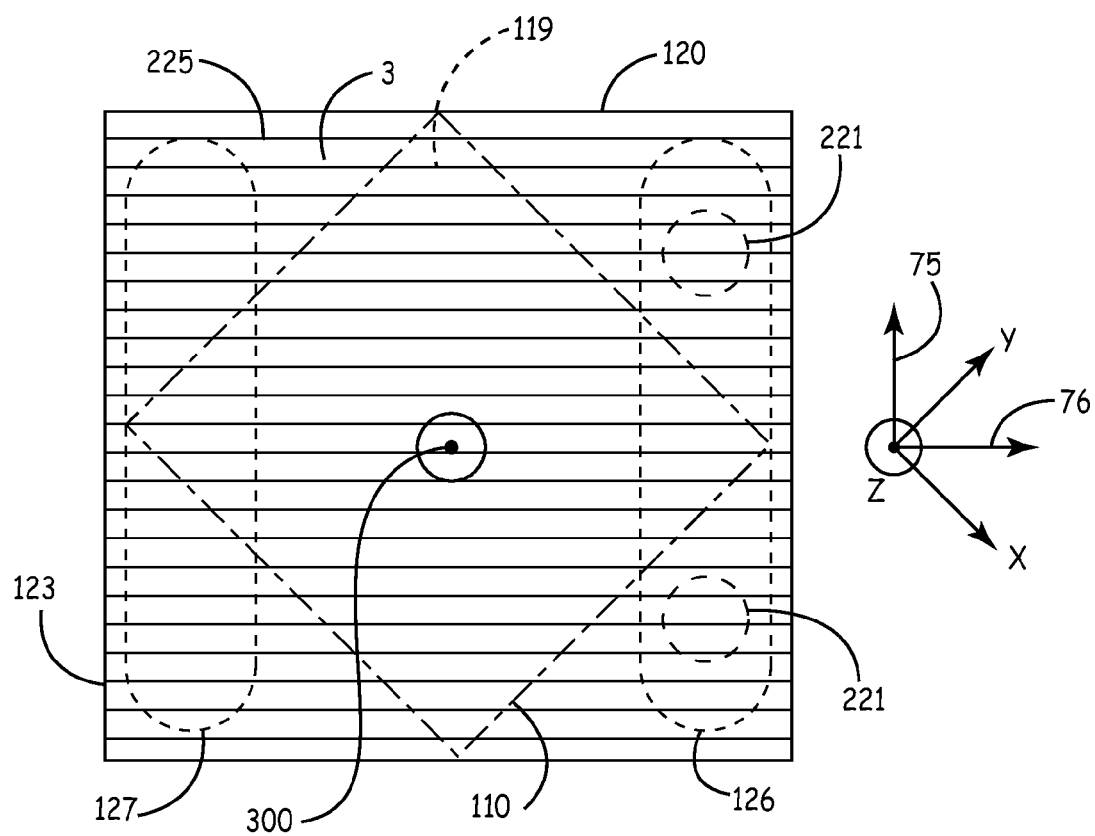
FIG. 7 shows a top view of an exemplary quarter wave plate operationally positioned with a VCSEL.

FIG. 7 shows a top view of an exemplary quarter wave plate 120 with operationally positioned with a VCSEL 110. The VCSEL 110 is shown as a dashed square since it is viewed through the quarter wave plate 120. The exemplary VCSEL emits light 300 that is linearly polarized along the y-axis.

In this exemplary embodiment, the quarter wave plate 120 includes grooves represented generally at 225, which run parallel to the vector 76 show in relation to the x, y, and z vectors in the coordinate system (x, y, z). If the quarter wave plate 120 die is tilted perpendicular to the direction of the grooves 225 (i.e., around an axis parallel to vector 75), the optical properties of the quarter wave plate 120 would be adversely affected. Accordingly, the quarter wave plate 120 is tilted around an axis that is perpendicular to the grooves 225 in the quarter wave plate 120. In one implementation of this embodiment, quarter wave plate 120 die on wafer 350 (FIG. 6) are diced perpendicular to the grooves 225 of the quarter wave plate 120. For operation, the quarter wave plate 120 is positioned on the first scaffold section 124 (FIG. 2) so that the grooves 225 are at a 45° angle with respect to the polarization direction (y axis) of the light 300 which is shown to be incident on approximately the center of the quarter wave plate 120. The quarter wave plate 120 is rotated by about 5°-8.5° about the edge 123 of the quarter wave plate 120 so that the surface 3 of the quarter wave plate 120 is not parallel to the output face 119 of VCSEL 110. The edge 123 is parallel to the grooves 225 in the quarter wave plate 120 (i.e., parallel to vector 75). In one implementation of this embodiment, center-to-center spacing between the edge portion 127 and the opposing edge portion 126 of the quarter wave plate 120 is about 800 μm. In this case, the separation between bond pads on the first scaffold section 124 is about 800 μm.

Figure 8:
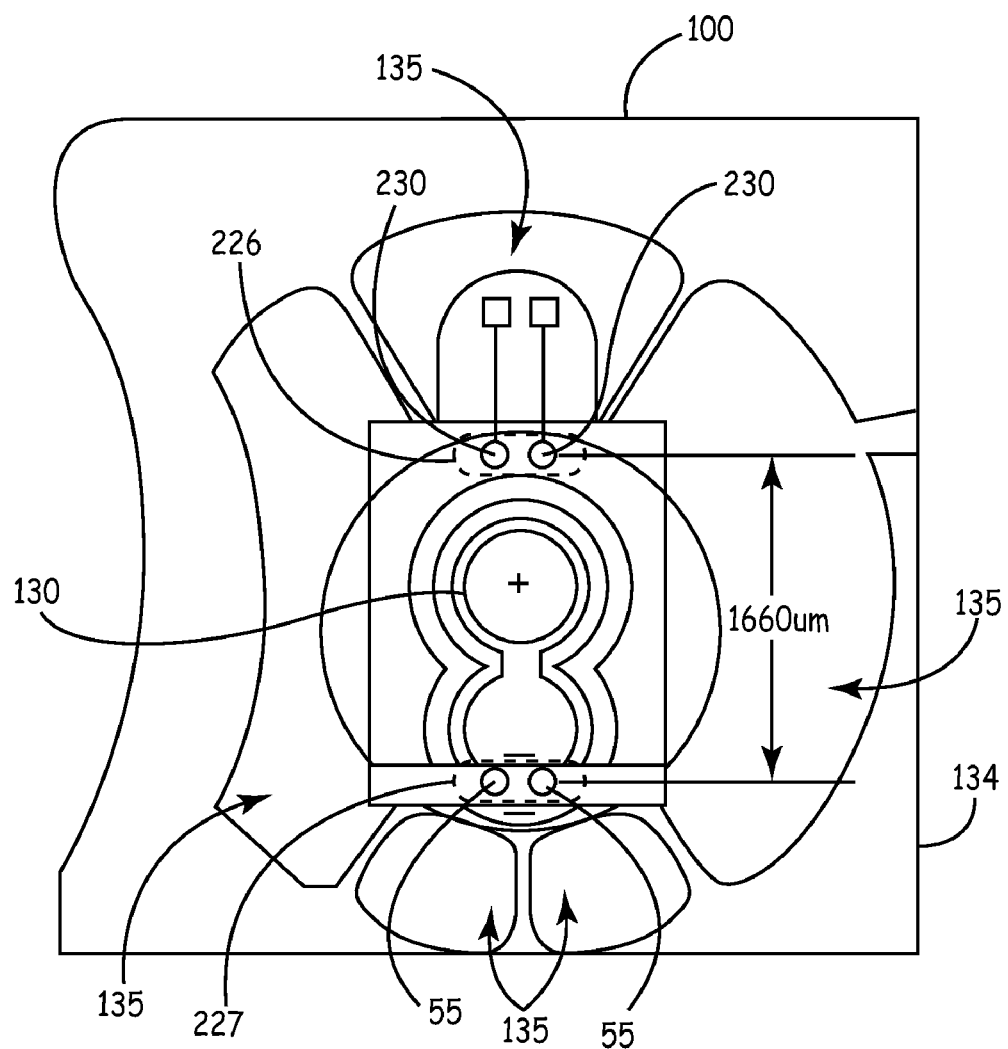
FIG. 8 shows a top view of an exemplary vapor cell positioned on the scaffolding in accordance with the present invention.

FIG. 8 shows a top view of an exemplary vapor cell 130 positioned on and attached to the second scaffolding section 134 in accordance with the present invention. The vapor cell 130 includes an edge portion 227, which opposes an edge portion 226. In one implementation of this embodiment, the center-to-center spacing for the edge portion 227 of the vapor cell 130 is 1660 μm. In this case, the separation between bond pads on the second scaffold section 134 is 1660 μm.

Table 2 shows the bond-pad to bond-pad spacing on all the other components 160, and the resulting tilt angles after the devices have been bonded in place for an exemplary CSAC. The bond-pad to bond-pad separation is approximately the distance from the opposing edge portions of the other components 160 (FIG. 1). In one implementation

TABLE 2

| Device | Bond-pad separation (μm) | Desired tilt angle (degrees) | Required thickness (μm) |
| --- | --- | --- | --- |
| QWP | 800 | 17.5-19 | 240-260 |
| Vapor Cell | 1600 | 7.5-8-5 | 210-235 |
| Detector | 800 | 7.5-8.5 | 105-120 | of this embodiment, the tilt angle of the quarter wave plate 120 is greater than or equal to 7° since the full-width-half-maximum (FWHM) divergence angle of the optical beam 300 emitted from the VCSEL is nearly 7°. The bond-pad to bond-pad separation from the may vary among the exemplary scaffolding designs for the first scaffold section 124, the second scaffold section 134, and the top scaffold section 144.

Thus, as described in FIGS. 1-8, there a plurality of embodiments of a chip-scale atomic clock (CSAC) 10 arranged on a scaffolding 100 in which the chip-scale atomic clock 10 includes a vertical cavity surface emitting laser (VCSEL) 110 positioned on a surface of the bottom scaffold section 114 of the scaffolding 100, a quarter wave plate 120 positioned on a first intermediate scaffold section 124, a vapor cell 130 positioned on a second intermediate scaffold section 134, and a detector 140 positioned on a top scaffold section 144 so that partially reflective surfaces 1-7 of the vapor cell 130 are non-parallel to an emitting surface 119 of the VCSEL 110.

Figure 9:
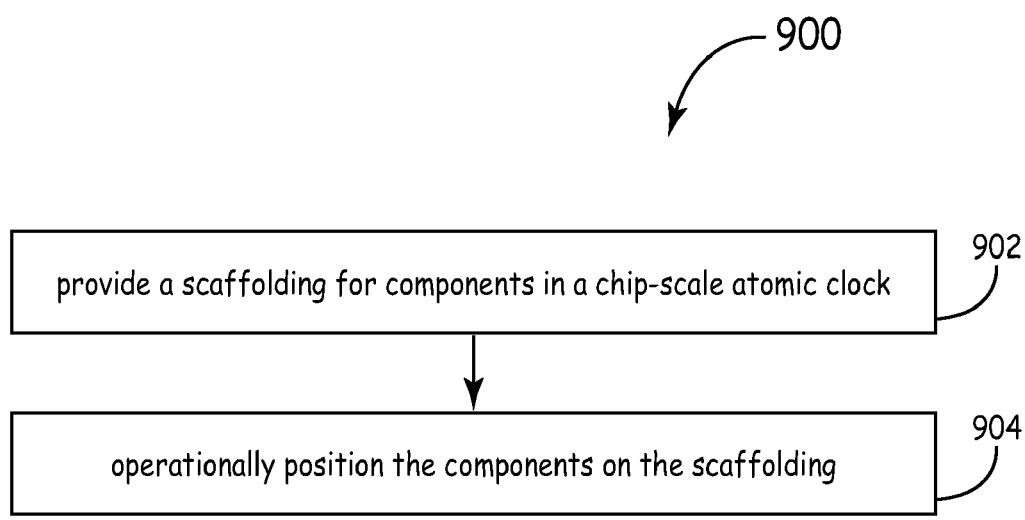
FIG. 9 is a flow diagram of one embodiment of a method to construct a chip-scale atomic clock in accordance with the present invention.

FIG. 9 is a flow diagram of one embodiment of a method 900 to construct a chip-scale atomic clock. In one implementation of this embodiment, the CSAC constructed in method 900 is the CSAC 10 described above with reference to FIGS. 2-8 although it is to be understood that method 900 can be implemented using other embodiments of the CSAC as is understandable by one skilled in the art who reads this document.

At block 902, a scaffolding is provided for components in a chip-scale atomic clock. The components include a laser and at least one other component. At block 904, the components are operationally positioned on the scaffolding 100 so that an emitting surface 119 of the laser 110 is non-parallel to partially reflective surfaces of the at least one other component 160. In one implementation of this embodiment, the at least one other component 160 includes the quarter wave plate 120, the vapor cell 130, and the detector 140. In another implementation of this embodiment, additional other components are included in the other components.

In one implementation of this embodiment, at least one post is positioned adjacent to a scaffold opening in a first intermediate scaffold section and a first other component is attached to the at least one post so the first other component spans the scaffold opening in the first intermediate scaffold section in an incline. Additionally, at least one post is positioned on a partially reflective surface of a second other component, and the post is placed adjacent to a respective scaffold opening so the second other component spans a scaffold opening in a second intermediate scaffold section in an incline.

In another implementation of this embodiment, posts are positioned adjacent to scaffold openings in both a first and second intermediate scaffold section and respective first and second other components are attached to the posts so the first and second other components span the scaffold openings in the first and second intermediate scaffold sections in an incline.

In yet another implementation of this embodiment, at least one post is positioned on a partially reflective surface of a respective first and second other component. The respective posts are positioned adjacent to respective scaffold openings so the first and second other components span the respective scaffold openings in the intermediate scaffold sections in an incline.

In yet another implementation of this embodiment, at least one post is positioned adjacent to a scaffold opening in a second intermediate scaffold section and a second other component is attached to the at least one post so the second other component spans the scaffold opening in the second intermediate scaffold section in an incline. Additionally, at least one post is positioned on a partially reflective surface of a first other component, and the post is placed adjacent to a respective scaffold opening so the first other component spans a scaffold opening in a first intermediate scaffold section in an incline.

In another implementation of this embodiment, posts are patterned on quarter wave plates while the quarter wave plates are on a wafer and posts are patterned on vapor cells while at least a portion of the vapor cells are on a wafer. In yet another implementation of this embodiment, posts are patterned on quarter wave plates while the quarter wave plates are on a wafer and posts are picked and placed on a vapor cell. In yet another implementation of this embodiment, posts are picked and placed on a quarter wave plate and posts are patterned on a vapor cell on quarter wave plates while the quarter wave plates are on a wafer. In yet another implementation of this embodiment, posts are picked and placed on a quarter wave plate and posts are picked and placed on a vapor cell. For each post on the other components 160, there are associated bond pads on the scaffolding 100.

Thus, the embodiments of the CSAC can be constructed in a plurality of different ways according to method 900 in order to tilt the partially reflective surfaces with respect to emitting surface of the laser.

Figure 10:
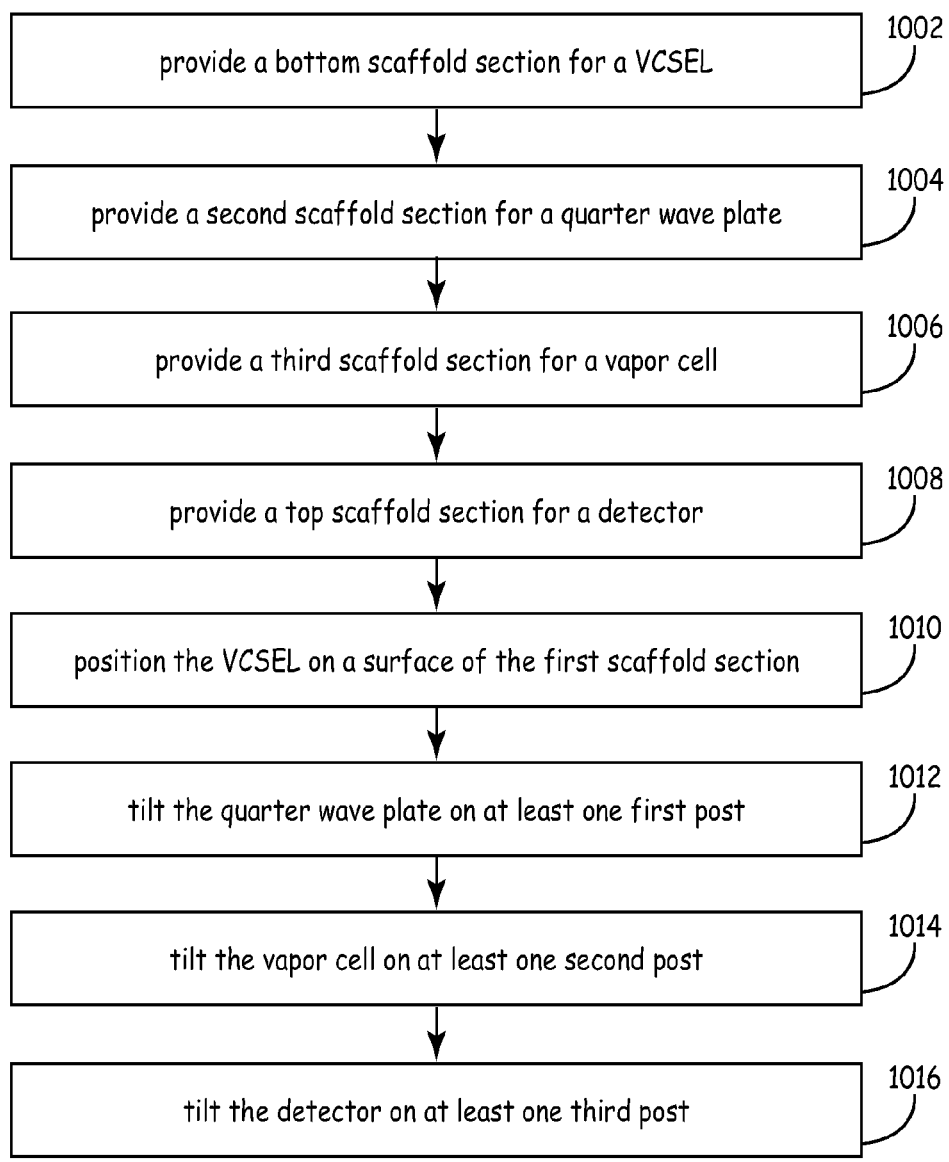
FIG. 10 is a flow diagram of one embodiment of a method to construct a chip-scale atomic clock in accordance with the present invention.

FIG. 10 is a flow diagram of one embodiment of a method 1000 to construct a chip-scale atomic clock 10. In one implementation of this embodiment, the CSAC constructed in method 1000 is the CSAC 10 described above with reference to FIGS. 2-8 although it is to be understood that method 1000 can be implemented using other embodiments of the CSAC as is understandable by one skilled in the art who reads this document.

At block 1002, a bottom scaffold section 114 is provided for a VCSEL 110. At block 1004, a second scaffold section 124 is provided for a quarter wave plate 120. At block 1006, a third scaffold section 134 is provided for a vapor cell 130. At block 1008, a top scaffold section 144 is provided for a detector 140.

At block 1010, the VCSEL 110 is positioned on a surface 115 of the first scaffold section 114. In one implementation of this embodiment, the surface 115 is a top surface of a heat sink 111. The VCSEL 110 is positioned to direct light 300 toward the quarter wave plate 120.

At block 1012, the quarter wave plate 120 is tilted on at least one first post 220 located between a first intermediate scaffold section 124 and a partially reflective surface 1 of the quarter wave plate 120. In this manner, the quarter wave plate 120 spans a scaffold opening 125 in the second intermediate scaffold section 124. The light 300 propagates from the VCSEL 110 to pass through the scaffold opening 125 to be non-normally incident on the quarter wave plate 120. The light 300 that passes through the quarter wave plate 120 is referred to as light 305. At block 1014, the vapor cell 130 is tilted on at least one second post 230 located between the second intermediate scaffold section 134 and a partially reflective surface 3 of the vapor cell 130. In this manner, the vapor cell 130 spans a scaffold opening 125 in the second intermediate scaffold section 124. The light 305 propagates from the quarter wave plate 120 to pass through the scaffold opening 155 to be non-normally incident on the vapor cell 130. The light 305 that passes through the vapor cell 130 is referred to as light 307.

At block 1016, the detector 140 is tilted on at least one third post located between a back surface 141 of the detector 140 and the top scaffold section 144. At least one post 240 is positioned between the top scaffold section 144 and an edge portion 427 of the back surface 141 of the detector 140. In this manner, the light 307 that passes through the vapor cell 130 is non-normally incident on the partially reflective surface 7 of the detector 140.

In this configuration, no portion of the optical beam emitted 300 by the laser 110 is reflected off of one of the several partially reflective surfaces 1-7 in the CSAC 10 back into the laser 110. Therefore, the wavelength and/or the output power level of the laser is not altered due to optical feedback effects and the clock frequency of the CSAC 10 is stable.

Although specific embodiments have been illustrated and described herein, it will be appreciated by those skilled in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method to construct a chip-scale atomic clock, the method comprising:
   providing a scaffolding for components in a chip-scale atomic clock, the components including a laser and at least one other component; and
   operationally positioning the components on the scaffolding, wherein an emitting surface of the laser is non-parallel to partially reflective surfaces of the at least one other component, and wherein at least one of the at least one other component spans a scaffold opening in the scaffolding at an incline angle.

2. The method of claim 1, further comprising:
   positioning at least one post adjacent to the scaffold opening, the scaffold opening associated with the at least one of the at least one other component, wherein operationally positioning the components on the scaffolding comprises:
   attaching the at least one of the at least one other component to the at least one post.

3. The method of claim 1, wherein the scaffolding comprises a bottom scaffold section, a top scaffold section, and intermediate scaffold sections, wherein the intermediate scaffold sections are located between the bottom scaffold section and the top scaffold section, wherein the intermediate scaffold sections have respective scaffold openings aligned with a center line that extends from the bottom scaffold section to the top scaffold section, and wherein the at least one other component includes intermediate components, the method further comprising:
   positioning at least one post adjacent to one side of each of the scaffold openings, wherein operationally positioning the components on the scaffolding comprises:
   attaching the intermediate components to the at least one post adjacent to the one side of each of the scaffold openings so the intermediate components span the respective scaffold openings at the incline angle.

4. The method of claim 1, wherein the scaffolding comprises a bottom scaffold section, a top scaffold section, and intermediate scaffold sections, wherein the intermediate scaffold sections are located between the bottom scaffold section and the top scaffold section, wherein the intermediate scaffold sections have respective scaffold openings aligned with a center line that extends from the bottom scaffold section to the top scaffold section, and wherein the at least one other component includes at least one intermediate component having at least one post attached to an edge portion of a partially reflective surface, the method further comprising:
   positioning the at least one post attached to the edge portion of the partially reflective surface adjacent to a respective scaffold opening so the at least one intermediate component spans the respective scaffold openings at the incline angle.

5. The method of claim 4, wherein the at least one intermediate component includes a quarter wave plate, the method further comprising:
   patterning a plurality of posts on a wafer of quarter wave plates, wherein the at least one post is patterned on a respective edge portion of respective quarter wave plates on the wafer.

6. The method of claim 5, wherein the intermediate components further include a vapor cell, the method further comprising:
   patterning a plurality of posts on a wafer of vapor cells, wherein the at least one post is patterned on a respective edge portion of respective vapor cells on the wafer.

7. The method of claim 5, wherein the intermediate components further include a vapor cell, the method further comprising:
   positioning a plurality of posts on a wafer of vapor cells, wherein the at least one post is positioned on the edge portion of the partially reflective surface of the vapor cells on the wafer.

8. The method of claim 4, wherein the intermediate components include a quarter wave plate, the method further comprising:
   positioning a plurality of posts on a wafer of quarter wave plates, wherein the at least one post is positioned on the edge portion of the partially reflective surface of the quarter wave plates on the wafer.

9. The method of claim 8, wherein the intermediate components further include a vapor cell, the method further comprising:
   patterning a plurality of posts on a wafer of vapor cells, wherein the at least one post is patterned on the edge portion of the partially reflective surface of the vapor cells on the wafer.

10. The method of claim 1, further comprising:
    positioning at least one post adjacent to the scaffold opening in a first intermediate scaffold section, wherein operationally positioning the components on the scaffolding comprises:
    attaching a first other component to the at least one post so the first other component spans the scaffold opening in the first intermediate scaffold section at a first incline angle;
    positioning at least one post on a partially reflective surface of a second other component adjacent to a respective scaffold opening so the second other component spans the scaffold opening in a second intermediate scaffold section at a second incline angle.

11. The method of claim 1, wherein providing the scaffolding for the components in the chip-scale atomic clock, comprises:
    providing a bottom scaffold section for a vertical cavity surface emitting laser (VCSEL);
    providing a second scaffold section for a quarter wave plate;
    providing a third scaffold section for a vapor cell; and
    providing a top scaffold section for a detector, wherein operationally positioning the components on the scaffolding comprises:
    positioning the VCSEL on a surface of a first scaffold section, wherein the VCSEL, in operation, emits light directed toward the quarter wave plate;
    tilting the quarter wave plate on at least one first post located between a first intermediate scaffold section and a partially reflective surface of the quarter wave plate;
    tilting the vapor cell on at least one second post located between a second intermediate scaffold section and a partially reflective surface of the vapor cell; and
    tilting the detector on at least one third post located between a back surface of the detector and the top scaffold section.

12. A chip-scale atomic clock (CSAC) arranged on a scaffolding, the chip-scale atomic clock comprising:
    a vertical cavity surface emitting laser (VCSEL) positioned on a surface of the first scaffold section of the scaffolding; and
    a vapor cell positioned on an intermediate scaffold section, wherein the vapor cell spans a scaffold opening in the scaffolding at an incline angle, wherein a partially reflective surface of the vapor cell is non-parallel to an emitting surface of the VCSEL, and wherein the VCSEL, when in operation, emits light propagating toward the vapor cell.

13. The CSAC of claim 12, further comprising:
a quarter wave plate positioned on a second scaffold section wherein a partially reflective surface of the quarter wave plate is non-parallel to the emitting surface of the VCSEL, wherein the intermediate scaffold section is a third scaffold section, wherein the emitted light propagates through the quarter wave plate before being incident on the vapor cell.

14. The CSAC of claim 13, further comprising:
a detector positioned on a top scaffold section, wherein a partially reflective surface of the detector is non-parallel to the emitting surface of the VCSEL, wherein the emitted light incident on the vapor cell propagates through the vapor cell to be incident on the detector, at least one post positioned between the top scaffold section and an edge portion of a back surface of the detector.

15. The CSAC of claim 13, further comprising:
at least one post positioned between an edge portion of the partially reflective surface of the quarter wave plate and the second scaffold section.

16. The CSAC of claim 12, further comprising:
at least one post positioned between an edge portion the partially reflective surface of the vapor cell and the intermediate scaffold section.

17. A method to tilt at least one partially reflective surface of a component with respect to an optical beam emitted from a laser comprising:
fabricating posts; and
arranging the fabricated posts between the at least one partially reflective surface and a surface of a scaffolding wherein at least one partially reflective surface spans a scaffold opening in an incline.

18. The method of claim 17, wherein fabricating posts comprises forming posts in a photo-patternable plastic on a wafer including a plurality of the components, wherein the partially reflective surface of the component is surface of the wafer, and wherein at least one post is formed on an edge portion of the partially reflective surface of at least two of the components on the wafer.

19. The method of claim 17, wherein fabricating posts comprises:
forming posts in a photo-patternable plastic, the method further comprising:
placing the posts on a wafer including a plurality of the components, wherein the partially reflective surface of the component is a surface of the wafer, and wherein the posts are placed on edge portion of the partially reflective surface of at least two of the components on the wafer.

20. The method of claim 17, wherein fabricating posts comprises:
forming posts in a photo-patternable plastic, the method further comprising:
placing at least one of the posts adjacent to one side of the scaffold opening in the scaffolding.

* * * * *